(12) United States Patent
Cao (10) Patent No.: US 7,527,773 B2
(45) Date of Patent: May 5, 2009

(54) RARE EARTH OXIDE NANOCRYSTALS AND METHODS OF FORMING

(75) Inventor: Yunwei Charles Cao, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 588 days.

(21) Appl. No.: 11/093,639

(22) Filed: Mar. 30, 2005

(65) Prior Publication Data

US 2008/0175779 A1 Jul. 24, 2008

Related U.S. Application Data

(60) Provisional application No. 60/557,511, filed on Mar. 30, 2004.

(51) Int. Cl.
*C01F 17/00* (2006.01)
*C30B 7/00* (2006.01)
*B01D 9/02* (2006.01)

(52) U.S. Cl. .......... 423/21.1; 423/263; 117/11; 501/126; 23/295 R; 23/297; 23/305 RE (58) Field of Classification Search .......... 423/21.1, 423/263; 23/295, 297, 305; 117/11; 501/126; 516/89

See application file for complete search history.

(56) References Cited

U.S. PATENT DOCUMENTS 7,105,051 B2 * 9/2006 Peng et al. .......... 117/68

2004/0089564 A1 * 5/2004 Kuse et al. .......... 206/307

OTHER PUBLICATIONS

R. Bazzi, M. A. Flores-Gonzaleza, C. Louisa, K. Lebboua, C. Dujardina, A. Breniera, W. Zhanga, O. Tillementa, E. Bernstein and P. Perriat, "Synthesis and luminescent properties of sub-5-nm lanthanide oxides nanoparticles" Journal of Luminescence V 102-103, May 2003 (available online Feb. 13, 2003), pp. 445-450.*

Murray, C. B. et al., Colloidal Synthesis of Nanocrystals and Nanocrystal Superlattices, IBM J. Res. & Dev., vol. 45, No. 1, pp. 47-56 (Jan. 1, 2001).

* cited by examiner

*Primary Examiner*—Ngoc-Yen M Nguyen
*Assistant Examiner*—Diana J Liao
(74) *Attorney, Agent, or Firm*—Saliwanchik, Lloyd & Saliwanchik (57) ABSTRACT

A method of forming rare earth oxide nanocrystals include the steps of dissolving a rare earth including compound in a solution containing at least one organic solvent, heating the solution to a temperature of at least 160° C., wherein a concentration of the rare earth including compound provided upon decomposition is sufficient to provide critical supersaturation of at least one active intermediate in the solution to nucleate a plurality of rare earth oxide nanocrystals. The plurality of rare earth nanocrystals are then grown, wherein the growing step proceeds at least in part in the absence of critical supersaturation of the active intermediate. The rare earth nanocrystals can assemble into at least one close-packed, ordered nanocrystal superlattice.

30 Claims, 6 Drawing Sheets

RARE EARTH OXIDE NANOCRYSTALS AND METHODS OF FORMING

CROSS-REFERENCE TO RELATED APPLICATIONS

This application claims the benefit of U.S. Provisional Patent Application No. 60/557,511 entitled "LANTHANIDE OXIDE AND ACTINIDE OXIDE NANOCRYSTALS AND METHODS OF FORMING" filed on Mar. 30, 2004 and is hereby incorporated by reference in its entirety into the present application.

STATEMENT REGARDING FEDERALLY SPONSORED RESEARCH OR DEVELOPMENT

Not applicable.

FIELD OF THE INVENTION

This invention relates to colloidal synthesis of rare earth oxide nanocrystals and nanocrystal superlattices, and more specifically methods for forming rare earth oxide nanocrystals and superlattices and resulting compositions of matter.

BACKGROUND OF THE INVENTION

The synthesis of anisotropic nanocrystals, such as nanorods, nanowires, nanotubes, and nanodisks, is of great importance to applications ranging from chemical and biological sensing, separation, and catalysis, to lasers and LEDs. The formation of anisotropic nanostructures has been achieved by shape control in the crystallization process that includes the steps of nucleation and growth. In colloidal synthesis, parameters including ligands, precursors and reaction temperature are chosen to affect the kinetics and thermodynamics in the nucleation and growth of nanocrystals to achieve shape control. In convention synthesis methods, precursor injection is used throughout the growth process. Such processes have led to the synthesis of a variety of nanocrystals including nanorods and nanowires, as well as PbS nanostars, Ag cubes and tetrapod-shaped CdTe NCs. However, precursor injection adds to process complication, introduces variability in results obtainable, and makes production scale-up difficult.

Nanocrystals may be used as the building blocks for close-packed nanocrystal solids. Under controlled conditions, provided the nanocrystals are highly uniform in size, the organic monolayer coordinating each nanocrystal surface enables uniform nanocrystal samples to self-assemble into nanocrystal superlattices.

SUMMARY OF THE INVENTION

This invention provides a new synthetic method for making high-quality colloidal rare earth oxide nanocrystals. A method of forming rare earth oxide nanocrystals includes the steps of dissolving a rare earth including compound in a solution containing at least one organic solvent, and heating the solution to a temperature of at least 160° C., wherein a concentration of the rare earth including compound provided upon decomposition is sufficient to provide critical supersaturation of at least one active intermediate in the solution to result in nucleation of a plurality of rare earth oxide nanocrystals. The plurality of rare earth nanocrystals are then grown, wherein the growing step proceeds at least in part in the absence of critical supersaturation of the active intermediate.

The organic solvent preferably includes at least one coordinating solvent, particularly when shape control or uniformity in nanocrystal size is desired, such as oleic acid. The organic solvent can include at least one non-coordinating solvent, such as octadecene. In another inventive embodiment, the organic solvent comprises at least one coordinating solvent and at least one non-coordinating solvent.

The dissolving step can be performed at a temperature of less than 100° C., such as 50° C. or 20° C. In a preferred embodiment of the invention, following the dissolving step, no further rare earth comprising compound is added to the solution. Such a "one-pot" method simplifies the process significantly as compared to conventional precursor injection-based processes, reduces variability in results obtainable, and clearly facilitates production scale-up. The dissolving step is preferably performed under vacuum. The heating step can be performed at a temperature of at least 300° C.

The invention provides high levels of dimensional uniformity and shape control for the rare earth oxide nanocrystals. For example, all respective dimensions of the plurality of rare earth nanocrystals can be within a standard deviation of less than 10%. The plurality of rare earth nanocrystals can be monodisperse. The thickness of the rare earth nanocrystals can be no more than two times a unit cell size of the nanocrystals. The plurality of rare earth nanocrystals can be square shaped (nanoplates) or triangular shaped.

The rare earth element can comprise gadolinium and said plurality of rare earth nanocrystals can comprise $Gd_2O_3$. The method can further comprise the step of solvent removal, wherein the plurality of rare earth nanocrystals self-assemble into at least one close-packed, ordered nanocrystal superlattice.

A composition of matter comprises a plurality of rare earth oxide nanocrystals, wherein all respective dimensions of said plurality of rare earth nanocrystals are within a standard deviation of less than 10%. A thickness of the plurality of rare earth nanocrystals can be no more than two times a unit cell size of the rare earth nanocrystals. The rare earth nanocrystals can have an average area of less than 100 nm, and an average thickness of no more than no more than two times a unit cell size of the nanocrystals. The plurality of rare earth nanocrystals can be monodisperse. In one embodiment, the plurality of rare earth nanocrystals are assembled into at least one close-packed, ordered nanocrystal superlattice.

BRIEF DESCRIPTION OF THE DRAWINGS

A fuller understanding of the present invention and the features and benefits thereof will be accomplished upon review of the following detailed description together with the accompanying drawings, in which:

FIG. 1(A) shows a scanned wide-angle x-ray diffraction (XRD), the standard diffraction peak positions of bulk cubic $Gd_2O_3$ being indicated; FIG. 1(B) shows a scanned small-angle XRD; FIGS. 1(C) and (D) show scanned transmission electron microscope (TEM) images of $Gd_2O_3$ nanoplates; while FIGS. 1(E) and (F) show a proposed model for the nanoplates and assembly of nanoplate stacks, respectively. The c-axis of cubic $Gd_2O_3$ crystals is assigned as the thickness direction of the nanoplates.

FIGS. 7(a) and (b) are scanned TEM images of triangular $Gd_2O_3$ nanoplates and superlattices formed from the triangular $Gd_2O_3$ nanoplates, respectively.

FIGS. 8(a) and (b) are scanned TEM zoom-in images of the superlattice of $Gd_2O_3$ nanoplates shown in FIG. 7(b) under high and higher magnification, respectively.

DETAILED DESCRIPTION

The present invention is more particularly described in the following examples that are intended to be illustrative only since numerous modifications and variations therein will be apparent to those skilled in the art. As used in the specification and in the claims, the singular form "a," "an," and "the" may include plural referents unless the context clearly dictates otherwise. Also, as used in the specification and in the claims, the term "comprising" may include the embodiments "consisting of" and "consisting essentially of."

A method of forming rare earth oxide nanocrystals includes the step of dissolving a rare earth containing compound in a solution containing at least one organic solvent. The organic solvent can be a coordinating solvent, a non-coordinating solvent, or at least one coordination solvent and at least one non-coordinating solvent. The dissolving step is preferably performed under vacuum and in a temperature range from 20° C. to 150° C. The vacuum is then preferably removed, such as under an inert gas (e.g. Ar) flow, and the solution is then heated to a temperature of at least 160° C., such as at a ramp rate of about rate 1° C./min to 30° C./min. Upon heating, the rare earth containing compound is decomposed to form at least one active reaction intermediate.

The decomposition of the rare earth containing compound is sufficient to provide a critical supersaturation of the reaction intermediate(s). Although not required to practice the claimed invention, mechanisms believed to be present during practice of the invention are described below. With the accumulation of the active reaction intermediates, a critical supersaturation is reached which initiates nucleation of nanocrystals, which is then followed by a growth stage for the plurality of nucleated nanocrystals. The nanocrystals are then separated from the solution, such as by precipitation, centrifugation or other separation technique. The nanocrystals formed are generally monodisperse, defined herein as being uniform in size to ±five atomic layers, preferably ±two atomic layers, and most preferably ±one atomic layer. The composition, shape, internal structure, and surface chemistry of the nanocrystals are also highly uniform.

Thus, the inventive method is achieved by separating nucleation and growth stages in a homogeneous solution without the need for rapid addition (or injection) of reagents. This embodiment of the invention overcomes the limitations of precursor injection-based colloidal synthesis regarding process complication, variability in results, and production scale-up difficulties.

At the reaction temperature, the concentration of the reaction intermediates is continuously increasing. When a critical supersaturation of these intermediates is reached, nucleation of nanocrystals occurs. Due to nanocrystal nucleation and growth of the nuclei, the intermediates are consumed rapidly. As a consequence, the concentration these intermediates drops below the critical nucleation supersaturation point, and the nucleation of nanocrystals is terminated, but the growth of the nucleated nanocrystals is continued until the concentration of the intermediates drops below the supersaturation point in reaction solution. Herein, the critical supersaturation point is defined as the concentration that is prerequisite for the nucleation of nanocrystals. The critical supersaturation point is a concentration level which is always higher than that of the supersaturation point.

An alternative synthetic approach involves a rapid addition (or injection) of a rare earth containing compound into a reaction vessel containing a hot solvent, such as in a temperature range from about 160° C. to 400° C. The temperature of the solution is sufficient to decompose the reagents into at least one reaction intermediate, the reaction intermediate quickly forming a critical supersaturation in solution that is relieved by nucleation of nanocrystals. Upon the nucleation event, the concentration of these species in solution drops below the critical concentration for nucleation, and further material can only add to the existing nuclei, which is accelerated by heating in what is termed herein as a growth step.

As used herein:

"Rare earth elements" refer to relatively abundant group of 17 elements composed scandium (atomic number 21), yttrium (atomic number 39), and 15 elements from lanthanum to lutetium (atomic numbers 57-71). They form a series of 17 chemically similar metals. Rare earth element comprising compounds include at least one rare earth element.

"Coordinating solvents" refer to solvents which influence the growth of crystals through variation in the crystal growth rate along different directions due to preferential binding to different surfaces. Coordinating solvents include, are but not limited to, fatty acids and fatty amines, organic phosphonic acids (e.g., octdecyl phosphonic acids), organic phosphine (e,g. trioctyl phosphine), and organic phosphine oxide (e.g., trioctyl phosphine oxide).

"Non-coordinating solvents" refers to solvents which do not significantly influence the growth of crystals through variation in the crystal growth rate along different directions, such as, but not limited to, long-chain alkene or alkanes, ethers (e.g., dioctyl ether, dibenzyl ether).

Nanoplates formed using the invention were found to be single crystalline with a thickness of the $Gd_2O_3$ unit-cell edge length which approached the lower limit of crystal growth. Although colloidal synthesis performed using the invention described in the Examples yielded square plate-shaped and triangular gadolinium-oxide ($Gd_2O_3$) nanocrystals, the nanocrystals can be other shapes including circular or other desired shapes depending on reaction conditions, such as temperature, concentration and solvent(s) selected. Nanocrystals formed have been found to have a very tightly distributed distribution of sizes and shapes, such as all respective dimensions within a standard deviation of less than 10%, and preferably within a standard deviation of 5%.

The nanocrystals can provide a thickness equal to or approaching the unit cell size of the rare earth oxide crystals. Thus, the invention can provide crystals that approach the lower limit of crystal growth.

The organic solvent can comprise a single solvent, such as the coordinating solvent oleic acid, or oleylamine, and other saturated and unsaturated fatty acids and amines such as myristic acid, stearic acid, and tetradecylamine, and stearyl amine. Oleic acid may also act as a surfactant. Each nanocrystal formed generally consists of a crystalline inorganic core coordinated by an organic monolayer provided by the coordinating solvent. Oleic acid is also known as 9-octadecenoic acid and has the formula $C_{18}H_{34}O_2$, and a boiling point of about 334.7° C. at 400 (mmhg). Accordingly, when oleic acid is used, the heating temperature for the crystal growth step is generally less than about 330° C. to avoid boiling off the solvent. Those having ordinary skill in the art will appreciate that the carbon chain length can be varied from the 18 carbons of oleic acid, such as from 8-22 carbons. In the case of a carbon chain length shorter than 18 carbons, the heating temperature should be reduced accordingly, and can be raised above 330° C. in the case more than 18 carbons.

The organic solvent can include at least one non-coordinating solvent, including long-chain alkene or alkanes, such as octadecene or octadecane, or as noted above the combination of at least one coordinating solvent and at least one non-coordinating solvent. Octadecene has the formula $C_{18}H_{36}$ and a boiling point at 400 mmHg of about 308° to 313° C. Analogous to the above, the non-coordinating solvent can have a variety of carbon chain lengths, such as from 8-22.

In another embodiment of the invention, a three (3) solvent system is used. For example, the coordinating solvents oleic acid and oleylamine can be used along with the non-coordinating solvent octadecene. Oleyl amine has the formula $CH_3(CH_2)_7CH=CH(CH_2)_8NH_2$ and a boiling point at 400 mmHg of about 348°-350° C. Oleyl amine may also function as a catalyst for the reaction in addition to being a coordinating solvent. The carbon chain length of the amine can also be varied, such as from 8 to 22 carbons.

Figure 1:
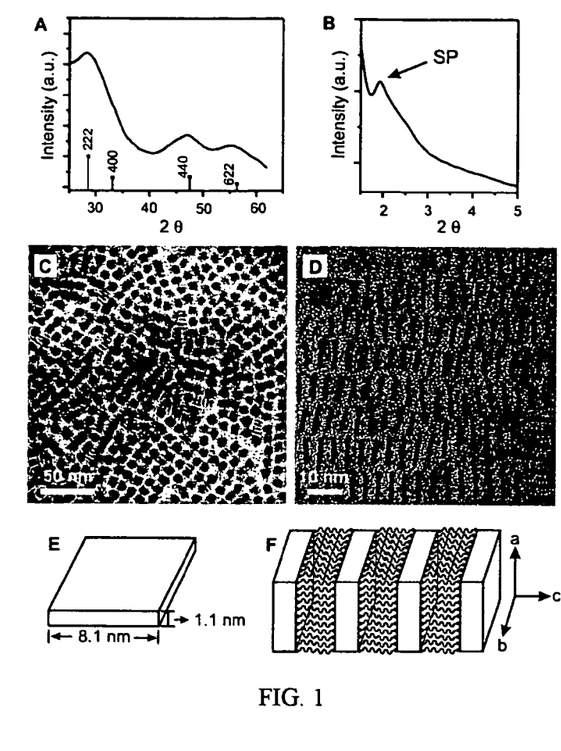

Following removal of the solvent, such as under slow evaporation from the concentrated nanocrystal solution, the nanocrystals simultaneously form close-packed, ordered nanocrystal superlattices (colloidal crystals). Formation of superlattices is known to evidence the high degree of uniformity in size of the nanocrystals. FIG. 1(F) shows such a resulting arrangement. The dark regions between the respective square nanocrystals shown are organic layers, such as derived from oleic acid.

The nanocrystal superlattices formed are generally waxy solids held together by weak van der Waals, and also include generally stronger magnetic forces in the cases of magnetic metals. The superlattices may be made more rigid and robust by selecting coordinating organic solvents/surfactants that will cross-link upon exposure to radiation (UV or electron beam) or upon heating. For example, heating an nanocrystal superlattice to about 300° C. under one atmosphere of an inert gas, such as argon, cross-links some organic groups, and can forming an amorphous carbon matrix between respective nanocrystals in the superlattice. In many nanocrystal superlattice systems, heating under vacuum can be used to lead to desorption of the organic groups and controlled sintering of the nanocrystals into a fully inorganic solid.

The invention can thus be used to prepare high quality rare earth oxide nanocrystals, which are of great importance to applications which benefit from optical and electronic properties arising from 4-f electrons. Some of lanthanide-oxide nanocrystals producible by the invention are expected to be of great importance to applications such as the contrast agents or biological markers for magnetic resonance imaging (MRI) and computed tomography (CT), high-performance luminescence devices, magnets, catalysts and other functional materials based on the optical and electronic properties arising from the 4-f electrons. Superlattices of gadolinium oxide nanoplates which may be formed using the invention have liquid-crystal properties, which may be useful for liquid crystal displays.

Nanoparticles according to the invention can also be used for biological assays based on fluorescence. For example, lanthanide sesquioxides (e.g., $Eu_2O_3$) exhibit strong emissions with long lifetimes that permit time-resolved fluorescence assays, avoiding the problems of the auto-fluorescence background emitted from the monitored biological species. Moreover, such lanthanide sesquioxides are very stable compounds. The stability of these nanocrystals against oxidation and photo-oxidation, in principle, would be much higher than the stability of II-VI semiconductor nanocrystals (e.g., CdSe)—the most widely investigated nanocrystal bio-markers. This robustness of lanthanide-oxide nanocrystals would make them particularly important for bio-assays that require a longer monitoring time.

EXAMPLES

The present invention is further illustrated by the following specific examples, which should not be construed as limiting the scope or content of the invention in any way. In the Examples section presented below, solution-phase synthesis of high-quality, square, plate-shaped and triangular $Gd_2O_3$ and $Eu_2O_3$ nanocrystals are described. It is noted that the Gd comprising nanocrystals could also include other stoichiometries such as $GdO(CO_2)$ or GdO because of the use of carboxylic-acid solvents/surfactants. Moreover, the rare earth oxides could be based on rare earth elements other than Gd or Eu.

Example 1

Gadolinium-oxide ($Gd_2O_3$) nanocrystals were synthesized by solution-phase decomposition of gadolinium-acetate precursors in the presence of both coordinating and non-coordinating solvents. In one experiment, gadolinium acetate hydrate (0.75 mmol, from Aldrich) was dissolved in a solution that contained oleylamine (1.7 ml), oleic acid (1 ml) and octadecene (2.7 ml) at room temperate with vigorous stirring under vacuum (~20 mtorr). The solution was then heated to 100° C. at 10 degrees C./min and then held at 100° C. for 30 minutes. The vacuum was then released, and using Ar flow, the resulting solution was heated to 320° C. over approximately five minutes. The solution was then cooled to room temperature after one hour at 320° C. The nanocrystals were precipitated from the solution by adding a mixture of hexane and acetone (1:4), and then dried under Ar flow. The as-prepared nanocrystals were found to be highly dispersible in nonpolar organic solvents such as toluene and hexane.

X-ray powder diffraction (XRD) date taken indicated that the nanocrystals consist of crystalline $Gd_2O_3$. The wide-angle XRD pattern of the nanocrystals shows the characteristic peaks of the cubic $Gd_2O_3$ crystal phase, which are broadened because of the finite crystalline domain size (FIG. 1A). This cubic phase has a bixbyite crystal structure with a space group Ia3 and a lattice constant of 1.08 nm. The unit cell of $Gd_2O_3$ is large and contains 80 atoms, which can be viewed as an ordered super-cell of fluorite structure with the gadolinium cations occupying the positions of the calcium cations.

Transmission electron microscopy (TEM, JEOL-JEM 2010 operated at 200 kV) provides evidence that the $Gd_2O_3$ nanocrystals are indeed square nanoplates rather than cubes. The edge length of each nanoplate is 8.1 nm with a standard deviation of 6% (See FIGS. 1C-F).

Upon evaporation of the solvent, the $Gd_2O_3$ nanoplates were found to assemble into "stacks" on the TEM grids, which led to ribbons of stacked plates lying on edge as shown in FIG. 1D. The face-to-face position of the stacked standing plates allows for a precise measurement of their thickness.

The thicknesses of these nanoplates were found to be identical, approximately 1.1 nm, without any measurable deviation.

Figure 2:
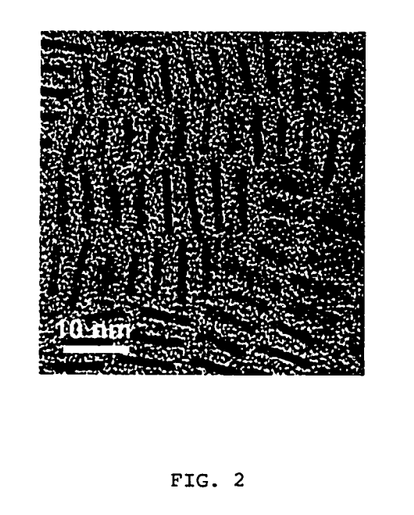
FIG. 2 is a scanned image from a high resolution transmission electron microscope (HRTEM) of $Gd_2O_3$ nanoparticles.

High-resolution TEM (HRTEM) was used to further investigate the crystal structure of the nanoplates. With the nanoplates lying on their faces, no clear lattice fringes were observed, which is partially because the plates are too thin (~1.1 nm) to generate a clear contrast against the carbon film. However, the lattice fringes were evident with the nanoplates standing on their edges. Along the thickness of the nanoplates, unusual double-lattice fringes were clearly revealed, indicating a two-layer periodicity of atomic arrangement as shown in FIG. 2. The corresponding lattice planes can be assigned to the (002) planes with an interplanar distance of 0.54 nm.

Figure 3:
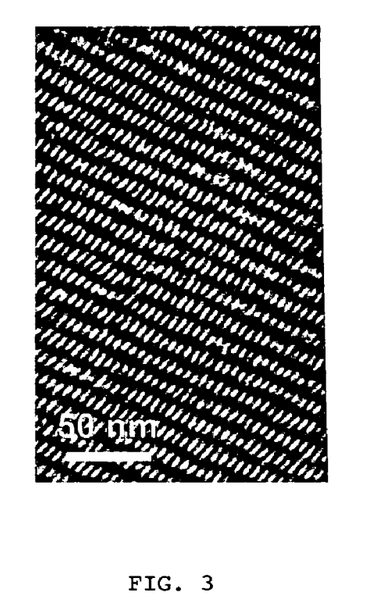
FIG. 3 is a scanned TEM image of a superlattice of $Gd_2O_3$ nanoplates.

Observing in a direction perpendicular to the thickness of the nanoplates, lattice fringes were found to have an interplanar distance of 0.27 nm, corresponding to the lattice spacing of either (400) or (040) planes. Taken together, these data are consistent with a crystal structure model for the nanoplate, which is enclosed by the {100} faces with the c-axis as the direction of the thickness, where the sides of a nanoplate are enclosed by the +/−(100) and +/−(010) faces, and the top and bottom by the +/−(001) faces. Therefore, the thickness of each nanoplate is the edge length of one unit cell of cubic $Gd_2O_3$ (1.08 nm), which is ordered superlattice structure of the nanoplates. FIG. 3 is a TEM image of the superlattice of $Gd_2O_3$ nanoplates.

Figure 4:
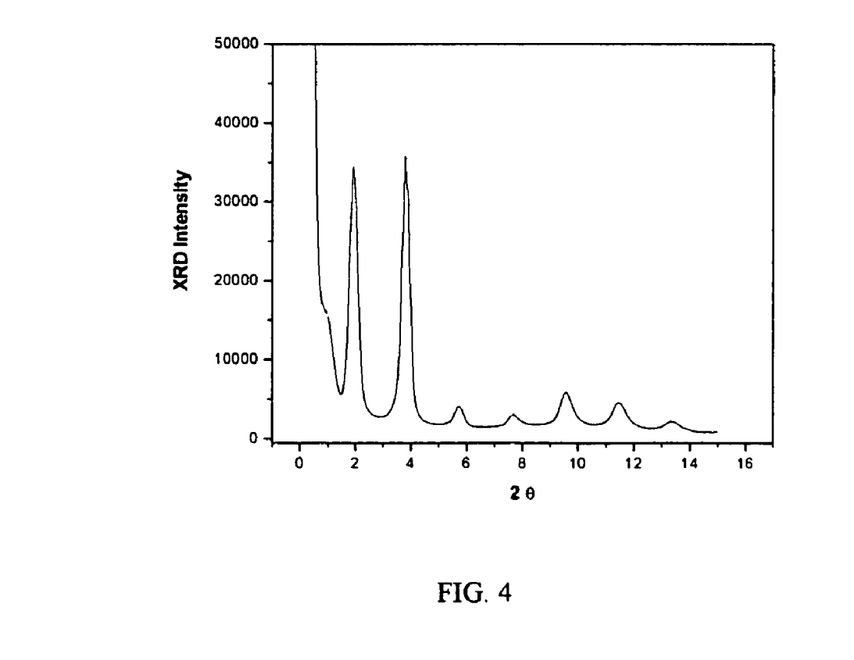
FIG. 4 is a scanned small-angle XRD of a highly ordered $Gd_2O_3$ nanoplate superlattice.

The closer diffraction spots represent a periodicity length of 4.2 nm, corresponding to the inter-particle distance in the nanoplate superlattice, which is consistent with TEM and small-angle XRD measurements as shown in FIG. 4. The other set of diffraction spots represents an order distance of 0.27 nm, corresponding to the lattice spacing of (040) in the nanoplates. These ED data provide further evidence for the structural mode of the nanoplates as shown in FIG. 1(F). The direction of the nanoplate stacking is along the c-axis—perpendicular to the a- and b-axes of the plates. Consequently, the two sets of diffraction spots are perpendicular, as shown in the ED pattern.

Figure 5:
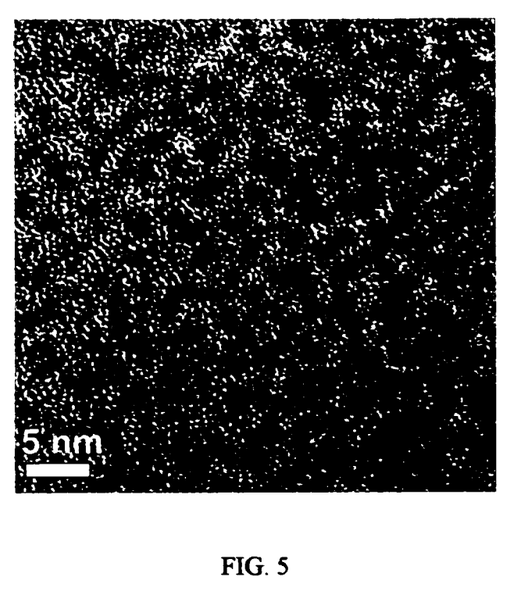
FIG. 5 is a scanned TEM image of nanoparticles synthesized using the coordinating solvent oleic acid alone.

To gain further insight into the growth mechanism of $Gd_2O_3$ nanoplates, a series of growth solvents were investigated. The use of the coordinating solvent oleylamine alone during the reaction resulted in white precipitates that were found to be insoluble in nonpolar solvents. On the other hand, the use of the coordinating solvent oleic acid alone produced very small particles (~2 nm). FIG. 5 shows a TEM image of nanoparticles synthesized using the solvent oleic acid alone. Such particles are expected to be highly useful for certain applications.

Figure 6:
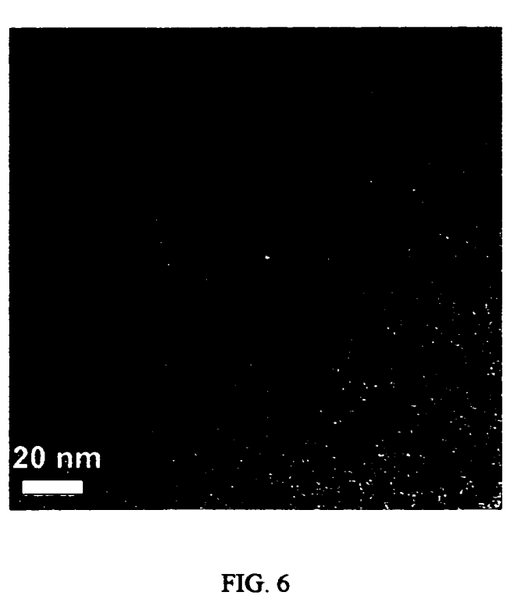
FIG. 6 is a scanned TEM image of nanoparticles synthesized using a process which includes the coordinating solvents oleic acid and oleyl amine together.

In the presence of both oleylamine and oleic acid, the reactions yielded nanoplates with broad distributions in both size and shape. FIG. 6 is a TEM image of nanoparticles synthesized with the coordinating solvents oleic acid and oleyl amine together.

When introducing octadecene, a noncoordinating solvent, into the oleyl amine and oleic acid mixture, the reaction led to nanoplates with very narrow size and shape distributions. These results indicate a three-solvent combination can be used for synthesis of high-quality nanoplates having a very narrow size distribution.

Example 2

Figure 7:
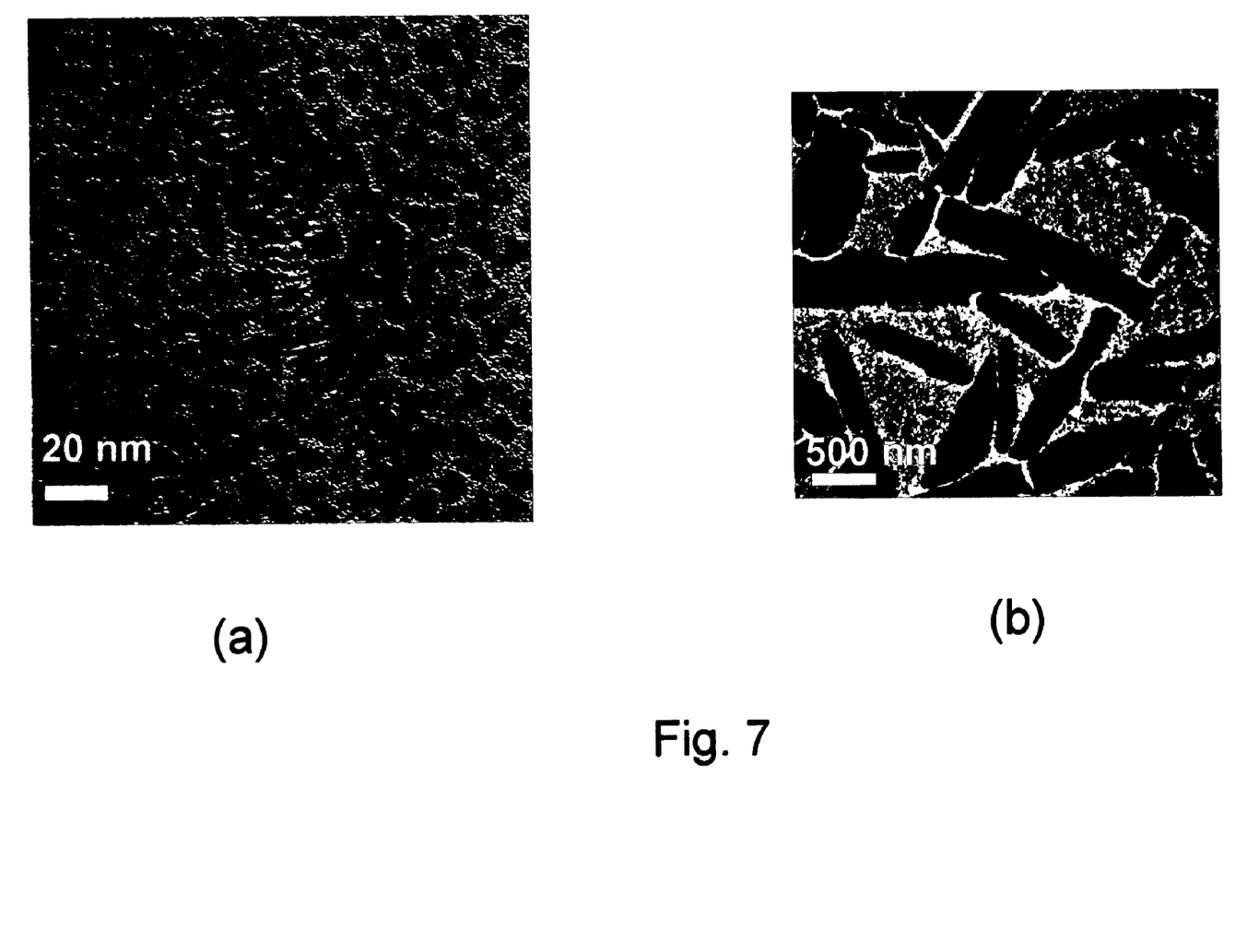
Figure 8:
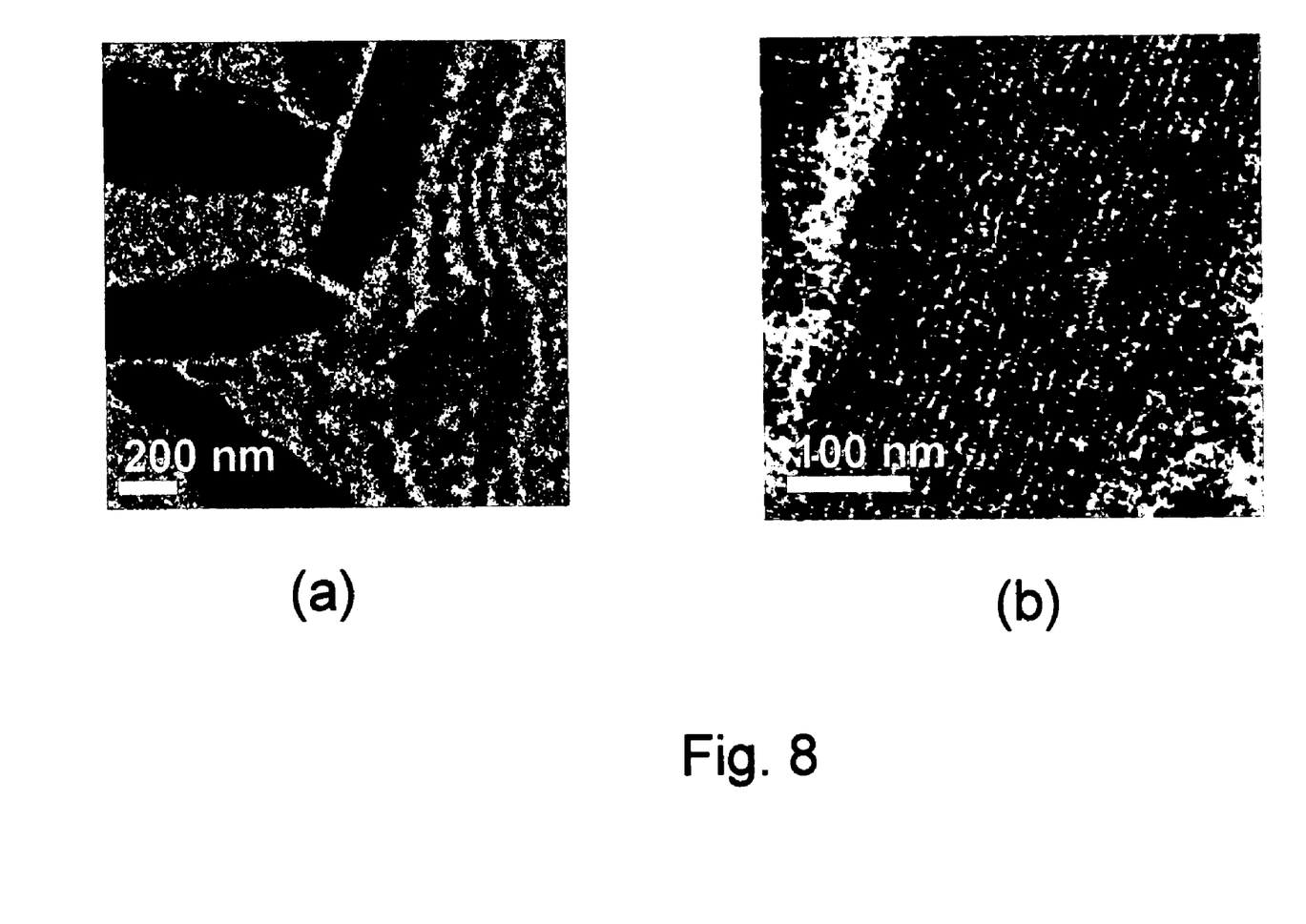

Gadolinium acetate hydrate (0.75 mmol, from Aldrich) was dissolved in a solution that contained oleylamine (1.7 ml), oleic acid (1 ml) and octadecene (2.7 ml) at 100° C. with vigorous stirring under vacuum (~20 mtorr) for 30 min. Under Ar flow, the resulting solution was heated to 320° C. over approximately five minutes, and then the nanocrystal growth was terminated by cooling reaction solution to room temperature after 30 min or 90 min. The nanocrystals were precipitated from the reaction solution by adding a mixture of hexane and acetone (1.4), and dried under Ar flow. The as-prepared nanocrystals were found to be highly dispersible in nonpolar organic solvents such as toluene and hexane. For the reaction with 30 mins, the size of the nanocrystals was about 4 to 5 nm. The size of the nanocrystals was uniform, and highly ordered superlattice structures were formed through the assembly of these nanocrystals. For the reaction with 90 min, nanocrystals with triangular shape were obtained. The edge length of these triangular nanocrystals was about 12 to 15 nm as shown in FIG. 7(a). Because of the high degree of size uniformity, following solvent removal, these triangular nanocrystals formed superlattice structures as shown in FIG. 7(b). FIGS. 8(a) and (b) are scanned TEM zoom-in images of the superlattice of $Gd_2O_3$ nanoplates shown in FIG. 7(b) under high and higher magnification, respectively.

Example 3

Europium acetate hydrate (0.75 mmol, from Aldrich) was dissolved in a solution that contained oleylamine (1.7 ml), oleic acid (1 ml) and octadecene (2.7 ml) at 100° C. with vigorous stirring under vacuum (~20 mtorr) for 30 min. Under Ar flow, the resulting solution was heated to 320° C. over approximately five minutes, and then the nanocrystal growth was terminated by cooling the reaction solution to room temperature after 30 min in one instance and in 90 minutes in another instance. The nanocrystals were precipitated from the reaction solution by adding a mixture of hexane and acetone (1:4), and then dried under Ar flow. The as-prepared nanocrystals were highly dispersible in nonpolar organic solvents such as toluene and hexane. These $Er_2O_3$ nanocrystals were found to have a triangular shape.

Example 4

Figure 9:
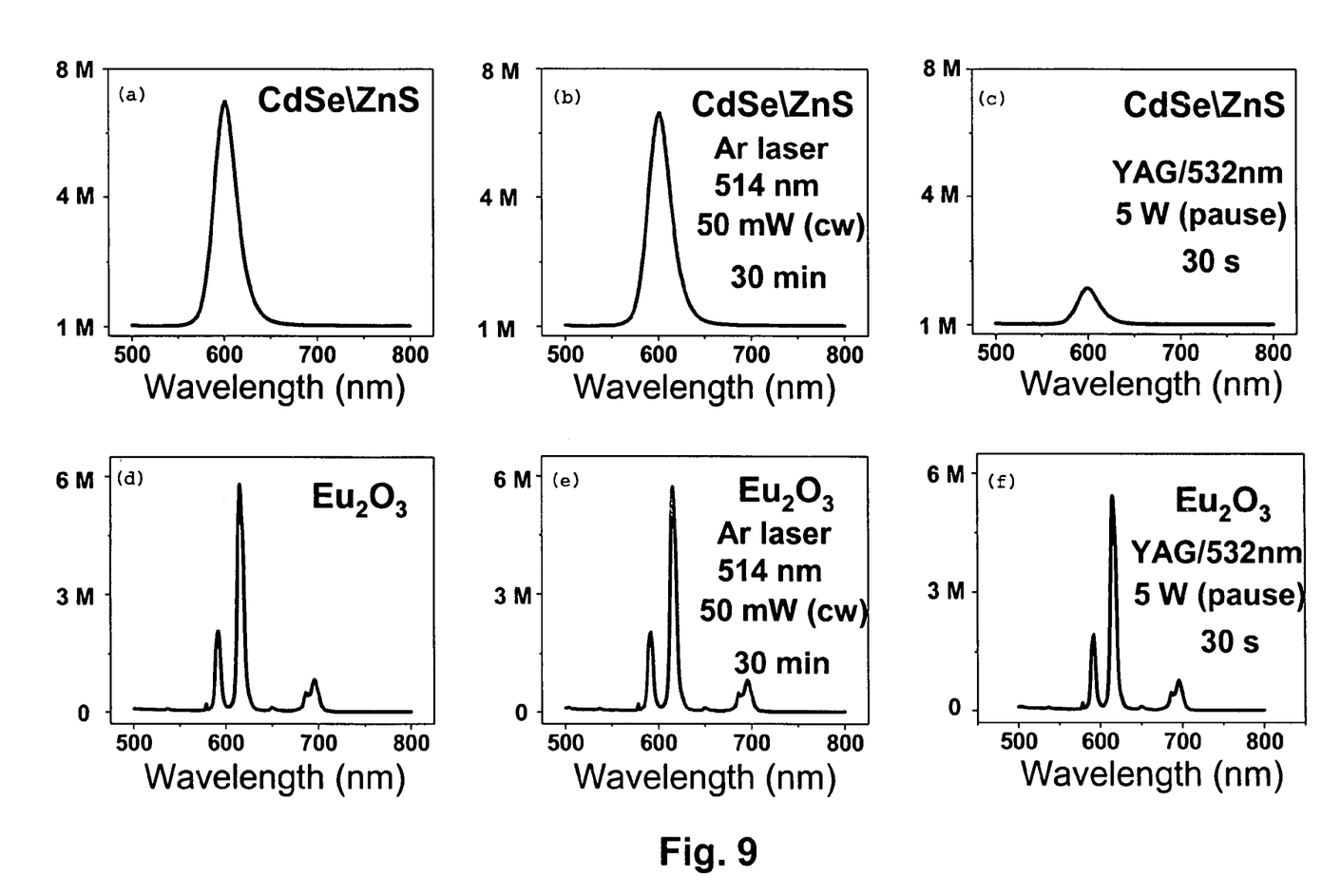
FIGS. 9(a)-(f) show data and results from a fluorescence spectra stability comparison between a conventional CdSe/ZnSe coreshell and $Eu_2O_3$ nanocrystals according to the invention.

A photostability comparison of $Er_2O_3$ nanocrystals according to the invention and conventional CdSe/ZnS coreshell nanocrystals was performed. $Er_2O_3$ and CdSe/ZnS nanocrystals were both dissolved in toluene. A typical fluorescence spectrum of CdSe/ZnS nanocrystals and $Er_2O_3$ nanocrystals formed according to the invention as described above is shown in FIGS. 9(a) and (d), respectively.

Two laser sources (one low power and one high power) were chosen to compare the stability of $Er_2O_3$ nanocrystals according to the invention and CdSe/ZnS core shell nanocrystals to optical irradiation. Before the laser irradiation experiments, $Er_2O_3$ and CdSe/ZnS coreshell nanocrystals solution were saturated with oxygen. Under low power irradiation (Ar ion laser; 514 nm, 30 mW) for 30 min, both $Er_2O_3$ and CdSe/ZnS core shell nanocrystals were found to be stable, as fluorescence intensities were not changed in either case as shown in FIGS. 9(b) and (e), respectively. However, under high power irradiation (YAG laser 530 nm, 5 W, pulse) for 3 s, the fluorescence intensity of the conventional CdSe/ZnS nanocrystals was found to decrease dramatically, showing the lack of stability of such nanocrystals under the tested conditions as shown in FIG. 9(c). In comparison, $Er_2O_3$ nanocrystals according to the invention remained stable under this high power laser irradiation condition as shown in FIG. 9(f). This experiments clearly demonstrates that $Er_2O_3$ nanocrystals according to the invention have higher level of photostability than that of CdSe/ZnS core shell nanocrystals. Such stability of nanocrystals is of importance to the applications in a variety of emission devices, including photodiode, and other light-emitting devices.

Although the invention has been described generally with respect to the rare earths Gd and Eu, According to the methods described above, other rare earth oxide colloidal nanocrystals and superlattices (i.e., yttrium oxide, lanthanum oxide, cerium oxide, europium oxide, dysprosium oxide, ytterbium oxide, terbium oxide, neodymium oxide, samarium oxide, holmium oxide, promethium oxide, praseodymium oxide, erbium oxide, thulium oxide, and lutetium oxide) have also been prepared.

Although the illustrative embodiments of the present disclosure have been described herein with reference to the accompanying drawings and description, it is to be understood that the disclosure is not limited to those precise embodiments, and various other changes and modifications may be affected therein by one skilled in the art without departing from the scope of spirit of the disclosure. All such changes and modifications are intended to be included within the scope of the disclosure as defined by the appended claims.

I claim:

1. A method of forming rare earth oxide nanocrystals, comprising the steps of:
    dissolving a rare earth comprising compound in a solution comprising at least one coordinating organic solvent of 8 to 22 carbon atoms;
    heating said solution to a temperature less than the boiling point of said solvent and of at least 160° C. to decompose said rare earth comprising compound thereby providing a sufficient critical supersaturation of at least one active intermediate in said solution to nucleate a plurality of rare earth oxide nanocrystals,
    growing said plurality of rare earth oxide nanocrystals, said growing step proceeding at least in part in the absence of said critical supersaturation of said active intermediate, and
    separating said plurality of rare earth oxide nanocrystals from said solution, wherein each of said rare earth oxide nanocrystals are in the form of nanoplates.

2. The method of claim 1, wherein said coordinating solvent comprises oleic acid.

3. The method of claim 1, wherein said solution further comprises at least one non-coordinating organic solvent of 8 to 22 carbon atoms.

4. The method of claim 3, wherein said non-coordinating solvent comprises octadecene.

5. The method of claim 1, wherein said organic solvent comprises at least one coordinating solvent and at least one non-coordinating solvent.

6. The method of claim 1, wherein said dissolving step is performed at a temperature of less than 100° C.

7. The method of claim 1, wherein following said dissolving step, no further rare earth comprising compound is added to said solution.

8. The method of claim 1, wherein said heating step is performed at a temperature of at least 300° C.

9. The method of claim 1, wherein all respective dimensions of each of said rare earth oxide nanocrystals are within a standard deviation of less than 10%.

10. The method of claim 1, wherein said plurality of rare earth oxide nanocrystals are monodisperse.

11. The method of claim 1, wherein a thickness of each of said rare earth oxide nanocrystals is no more than two times a unit cell size of said rare earth oxide nanocrystals.

12. The method of claim 1, wherein said rare earth comprising compound comprises gadolinium and said plurality of rare earth oxide nanocrystals comprise $Gd_2O_3$.

13. The method of claim 1, wherein said nanoplates are square or triangular shaped.

14. The method of claim 1, wherein said dissolving step is performed under vacuum.

15. The method of claim 1, further comprising the step of solvent removal, wherein said plurality of rare earth nanocrystals self-assemble into at least one close-packed, ordered nanocrystal superlattice.

16. The method of claim 1, wherein said coordinating organic solvent has 8 carbon atoms.

17. The method of claim 1, wherein said coordinating organic solvent has 9 carbon atoms.

18. The method of claim 1, wherein said coordinating organic solvent has 10 carbon atoms.

19. The method of claim 1, wherein said coordinating organic solvent has 11 carbon atoms.

20. The method of claim 1, wherein said coordinating organic solvent has 12 carbon atoms.

21. The method of claim 1, wherein said coordinating organic solvent has 13 carbon atoms.

22. The method of claim 1, wherein said coordinating organic solvent has 14 carbon atoms.

23. The method of claim 1, wherein said coordinating organic solvent has 15 carbon atoms.

24. The method of claim 1, wherein said coordinating organic solvent has 16 carbon atoms.

25. The method of claim 1, wherein said coordinating organic solvent has 17 carbon atoms.

26. The method of claim 1, wherein said coordinating organic solvent has 18 carbon atoms.

27. The method of claim 1, wherein said coordinating organic solvent has 19 carbon atoms.

28. The method of claim 1, wherein said coordinating organic solvent has 20 carbon atoms.

29. The method of claim 1, wherein said coordinating organic solvent has 21 carbon atoms.

30. The method of claim 1, wherein said coordinating organic solvent has 22 carbon atoms.

* * * * *

UNITED STATES PATENT AND TRADEMARK OFFICE
CERTIFICATE OF CORRECTION

PATENT NO. : 7,527,773 B2  
APPLICATION NO. : 11/093639  
DATED : May 5, 2009  
INVENTOR(S) : Yunwei Charles Cao Page 1 of 1

It is certified that error appears in the above-identified patent and that said Letters Patent is hereby corrected as shown below:

<u>Column 2,</u>
Line 40, "no more than no more than" should read --no more than--.

<u>Column 4,</u>
Line 2, "the concentration these" should read --the concentration of these--.

<u>Column 5,</u>
Line 11, "in the case more than 18 carbons" should read
    --in the case of more than 18 carbons--.

<u>Column 5,</u>
Lines 46-47, "and can forming an amorphous carbon" should read
    --and can form an amorphous carbon--.

Signed and Sealed this

Sixth Day of October, 2009

David J. Kappos
*Director of the United States Patent and Trademark Office*